(12) United States Patent
Shelnut

(10) Patent No.: US 6,613,495 B2
(45) Date of Patent: Sep. 2, 2003

(54) I-LINE PHOTORESIST COMPOSITIONS

(75) Inventor: James G. Shelnut, Northboro, MA (US)

(73) Assignee: Shipley Company, L.L.C., Marlborough, MA (US)

(*) Notice: Subject to any disclaimer, the term of this patent is extended or adjusted under 35 U.S.C. 154(b) by 89 days.

(21) Appl. No.: 09/176,867

(22) Filed: Oct. 22, 1998

(65) Prior Publication Data

US 2002/0076650 A1 Jun. 20, 2002

Related U.S. Application Data

(63) Continuation of application No. 08/878,398, filed on Jun. 18, 1997, now Pat. No. 5,910,394.

(51) Int. Cl.$^7$ ................................................. G03F 7/038
(52) U.S. Cl. ..................... 430/280.1; 430/270.1; 430/905; 430/920; 430/286.1; 522/63
(58) Field of Search ........................... 430/280.1, 286.1, 430/270.1, 905, 920; 522/63

(56) References Cited

U.S. PATENT DOCUMENTS

| | | | |
|---|---|---|---|
| 3,954,475 A | 5/1976 | Bonham et al. | 96/67 |
| 4,189,323 A | 2/1980 | Buhr | 430/281.1 |
| 4,232,106 A | 11/1980 | Iwasaki et al. | 430/170 |
| 4,826,753 A | 5/1989 | Higashi et al. | 430/281.1 |
| 5,034,304 A | 7/1991 | Feely | 430/270.1 |
| 5,057,397 A | 10/1991 | Miyabe et al. | 430/270.1 |
| 5,128,232 A | 7/1992 | Thackeray et al. | 430/192 |
| 5,298,364 A | 3/1994 | Pawlowski et al. | |
| 5,340,697 A | 8/1994 | Yoshimoto et al. | 430/270.1 |
| 5,366,846 A | 11/1994 | Knudsen et al. | 430/280.1 |
| 5,368,783 A | 11/1994 | Kobayashi et al. | 430/325 X |
| 5,719,008 A | 2/1998 | Hozumi et al. | 430/287.1 |
| 5,910,394 A * | 6/1999 | Shelnut | 430/280.1 |

FOREIGN PATENT DOCUMENTS

| | | |
|---|---|---|
| EP | 0 458 325 A1 | 11/1991 |
| EP | 0 483 693 A2 | 5/1992 |
| EP | 0 621 509 | 10/1994 |
| EP | 0 672 954 A2 | 9/1995 |

OTHER PUBLICATIONS

JP 63075737 A2—Chemical Abstract Only—Date of Ref. Abstract Apr. 1988.
JP 05,281,727—Chemical Abstract Only—Date of Ref. Abstract Oct. 1993.
JP 05,303,196—Chemical Abstract Only—Date of Ref. Abstract Nov. 1993.
CA 2,100,392—Chemical Abstract Only—Date of Ref. Abstract Feb. 1994.

* cited by examiner

Primary Examiner—Cynthia Hamilton
(74) Attorney, Agent, or Firm—Peter F. Corless

(57) ABSTRACT

Negative photoimageable compositions are disclosed which contain a radiation sensitive component for producing an acid when subjected to radiation at wavelengths of 320 to 420 nanometers, a resin binder and a reactive oligomer. The compositions are useful in constructing printed circuits and integrated circuit packages.

3 Claims, No Drawings

I-LINE PHOTORESIST COMPOSITIONS

This application is a continuation of application Ser. No. 08/878,398 now U.S. Pat. No. 5,910,394 filed on Jun. 18, 1997.

BACKGROUND OF THE INVENTION

1. Field of the Invention

This invention relates to i-line photoresist compositions for printed circuit applications which are imageable by exposure at i-line wavelengths of about 320 to 420 nanometers. In particular this invention is directed to a photoresist composition that will unexpectedly reduce line growth of the resist image of the printed circuit and unexpectedly has a longer shelf (storage) life than would have been expected.

2. Description of the Art

Photoresists are photosensitive films used to transfer images to a substrate. They are applied as liquid coatings or dry film compositions to a substrate to provide a photosensitive resist article. After forming the film on the substrate, the film is exposed through a patterned photomask to a source of activating energy such as light to form a latent image thereon after development. The photomask has areas opaque to activating radiation and other areas transparent to activating radiation. The pattern in the photomask of opaque and transparent areas defines a desired image that may be used to transfer the image to a substrate. A relief image is provided by development of the latent image pattern in the resist coating. The use of photoresist coatings is generally described, for example, by DeForest, Photoresist Materials and Processes, McGraw Hill book Company, New York (1975), and by Moreau, Semiconductor Lithography, Principals, Practices and Materials, Plenum Press, New York (1988) as well as in U.S. Pat. No. 5,366,846, the entire contents of this patent are incorporated herein by reference hereto. While the teachings of the above mentioned U.S. Pat. No. 5,366,846 are quite significant, it has been found that after development of the imaged photoresists, line growth of the resist had occurred. Therefore, there is still a need for better sidewall definition without substantial line growth during processing. The composition of the present invention provides a composition that even further reduces line growth of the resist sidewalls during development. Line growth produces etched lines which do not properly reproduce the desired geometries as defined by the mask.

Reference should also be had to the following for a greater understanding of the art: U.S. Pat. Nos. 5,034,304; 5,128,232; 4,189,323, 3,954,475 5,057,397, 5,340,697, 4,826,753, 5,180,653, 5,340,697, and the following patents or publications: Canadian Patent No. 2100,392, Japan 63075737A2, Japan 05,303,196; 05,281,727 and European Patent Application Nos. 0 458 325, 0 519 298, 0 621,509, 0 483,689, 0 483,693 and 0,672,954.

SUMMARY OF THE INVENTION

The present invention provides novel radiation sensitive coating compositions that are characterized in part as providing a cured coating layer that exhibits substantial flexibility as well as reducing line growth thereof during processing after a photoimaging step. In general, a composition of the invention comprises a resin binder, a reactive oligomer that comprises one or more internal crosslinking groups, and a radiation sensitive component (photoacid generator) that is photoactivatable at a wavelength of from about 320 to 420 nanometers. Such materials may be a substituted triazine compound or a substituted oxadiazole compound which produces an acid when activated by light energy at the wavelengths set forth above. As used herein, the term "reactive oligomer" refers to a material that is a polymer molecule containing a number of repeating units, e.g., 2 to 50 and that is crosslinkable when in contact with photogenerated acid such as provided by triazines and oxadiazoles. Such reactive oligomers include materials such as the epoxidized butadiene family (See U.S. Pat. No. 5,366,846 incorporated herein by reference hereto), acetals, vinyl ethers and others as would be clear to those skilled in the art after reading this application.

While substantially non-reactive resin binders are suitably employed in the compositions of the invention, preferably the resin binder is a reactive polymer that can undergo photoactivated crosslinking with one or more components of the composition.

A variety of resin binders can be employed. Suitable reactive resins are those that contain a functional group that can react with one or more other components of the composition, for example a reactive hydrogen containing resin. Generally preferred reactive resins are phenolic resins. With respect to the crosslinker component, a variety of crosslinking agents may be employed. Preferred crosslinkers include an epoxy-containing materials and amine-based crosslinkers such as melamines, ureas, guanamines and mixtures thereof. Such crosslinkers will cure to form a polymerized network with the resin binder and reactive oligomer. Compositions of the invention are suitable for use as a liquid coating composition as well as a dry film.

The compositions of the invention have utility in a variety of applications. Hence, the invention includes processes employing the compositions of the invention, including processes for forming a relief image, processes for forming an imaged dielectric layer on a substrate, and processes for the manufacture of printed circuit boards, additive printed circuits, multilayer printed circuits, high density printed circuits, flexible circuits, surface mount devices, multichip modules, sequential build and other articles. The invention further provides novel articles of manufacture comprising substrates coated with the compositions of the invention.

The terms "crosslink", "crosslinking" and other such terms used herein refer to any reaction of one or more of the components of a composition of the invention that results in reduced developer solubility of the composition.

Products such as these above are first photochemically set, the unwanted areas removed, and the remaining organic material is thermally fully set, i.e., hardened to its ultimate state.

DETAILED DESCRIPTION OF THE INVENTION

A composition of the invention in general comprises a resin binder, an acid sensitive crosslinkable oligomer and a radiation activated component which produces an acid after radiation is directed thereon at wavelengths between about 320 to 420 nanometers. Preferably the compositions further include a crosslinking agent component in addition to the reactive oligomer.

The resin binder component may comprise a nonreactive resin or, preferably, the resin binder is a reactive resin that can undergo photoinitiated crosslinking with one or more components of the composition either photochemically or thermally. The resin binder preferably imparts aqueous alkaline developability to the composition. Thus, preferred resin binders include resins that contain polar functional groups, such as hydroxyl or carboxylate, that can impart aqueous alkaline developability. Further, the resin binder component is preferably employed in a composition in a concentration sufficient to render unexposed portions of a coating layer of the composition aqueous alkaline developable.

The term "nonreactive resin" as used herein refers to a resin that does not substantially polymerize with one or more of the components of the composition upon photoactivation of the same. Thus, upon curing of a composition, a nonreactive resin binder typically will be encapsulated within the polymerizable component(s) of the composition. Suitable nonreactive resins include, for example, urethanes, silicones, acrylates and the like. The resin binder component suitably may comprise both nonreactive and reactive resin binders.

A reactive resin binder is suitably any of a variety of materials that will undergo photoinitiated crosslinking with one or more components o the composition. Thus suitable resins include those that contain one or more reactive moieties, for example a functionality that contains a reactive hydrogen. Phenolic resins are particularly suitable reactive resins and are preferably employed in a concentration sufficient to render a coating layer of the composition developable with an aqueous alkaline solution or semi-aqueous alkaline solution. Suitable phenolic resins include, for example, phenol aldehyde condensates known in the art as the novolak resins, homo and copolymers of alkenyl phenols, partially hydrogenated novolak and poly(vinylphenol) resins, and homo and copolymers of N-hydroxyphenyl-maleimides.

Of the phenolic resins suitable as a reactive resin for the compositions of the invention, the phenol formaldehyde novolaks are preferred materials as the novolaks are able to form an aqueous alkaline developable, photoimageable coating composition. These resins are made following procedures known and disclosed in numerous publications such as DeForest, *Photoresist Materials and Processes,* McGraw-Hill Book Company, New York, Ch. 2, 1975; Moreau, *Semiconductor Lithography Principles, Practices and Materials,* Plenum Press, New York, Chs. 2 and 4, 1988; and Knop and Pilato, *Phenolic Resins,* Springer-Verlag, 1985, all said publications incorporated herein by reference for their teaching of making and using novolaks and other phenolic resins.

More particularly, novolak resins are the thermoplastic condensation product of a phenol and an aldehyde. Examples of suitable phenols for condensation with an aldehyde, especially formaldehyde, for the formation of novolak resins, include phenol; m-cresol; o-cresol; p-cresol; 2,4-xylenol; 2,5-xylenol; 3,4-xylenol; 3,5-xylenol; thymol and mixtures thereof. An acid catalyzed condensation reaction results in the formation of a suitable novolak resin which may vary in molecular weight from about 500 to 100,000 daltons. Preferred novolak resins include the cresol formaldehyde condensation products.

Another preferred reactive resin is a poly(vinylphenol) resin. Poly(vinylphenols) are thermoplastic materials that may be formed by block polymerization, emulsion polymerization or solution polymerization of corresponding monomers in the presence of a cationic catalyst. Vinylphenols used for production of poly(vinylphenol) resins may be prepared, for example, by hydrolysis of commercially available coumarins or substituted coumarins, followed by decarboxylation of the resulting hydroxy cinnamic acids. Useful vinyl phenols may also be prepared by dehydration of the corresponding hydroxyalkyl phenol or by decarboxylation of hydroxy cinnamic acids resulting from the reaction of substituted or non-substituted hydroxy benzaldehydes with malonic acid. Preferred poly(vinylphenol) resins prepared from such vinyl phenols have a molecular weight range of from about 2,000 to about 100,000 daltons. Procedures for the formation of poly(vinylphenol) resins also can be found in U.S. Pat. No. 4,439,516 incorporated herein by reference.

Other suitable reactive resin are polymers containing phenolic units and nonaromatic cyclic alcohol unites analogous in structure to the novolak resins and poly(vinylphenol) resins. Such copolymer resins are described in European Published Patent Application No. 0 401 499 having a publication date of Dec. 12, 1990 and incorporated herein by reference.

An additional class of suitable phenolic reactive resins include homo and copolymers of N-hydroxyphenyl maleimides. Such materials are disclosed in European Published Appln. No. 0,255,989 beginning on page 2, line 45 and continuing to page 5, line 51, incorporated herein by reference.

The concentration of the resin component of the compositions of the invention may vary within relatively broad ranges, and in general the resin component is between about 30 and 60 or more weight percent of total solids of the compositions. In general a reactive resin is employed in a composition in a concentration of from about 0 (where only nonreactive resin(s) are employed) to 60 or more weight percent of the total solids of the composition. As used herein, the term total solids of a composition refers to all components of a composition other than a solvent carrier.

Another component of the compositions of the invention is preferably a reactive oligomer such as an epoxidized polybutadiene that comprises one or more internal epoxide groups. The epoxidized polybutadiene suitably may also contain reactive groups in addition to one or more internal epoxy functionalities. For example, the butadiene may contain one or more vinyl groups, hydroxyl groups, carboxyl groups or pendant and/or terminal epoxy groups.

Particularly preferred epoxidized polybutadienes of the compositions of the invention are represented by the following formula (I):

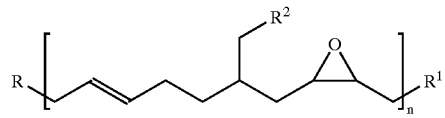

where R and $R^1$ are each independently selected from the group consisting of hydrogen, substituted and unsubstituted alkyl, substituted and unsubstituted aryl and a reactive group such as hydroxy, epoxy or an alkylene group, for example an alkylene group having from 2 to 10 carbon atoms, more typically having 2 carbon atoms. Suitable alkyl groups include those having from 1 to about 10 carbon atoms more typically from 1 to about 6 carbon atoms. Phenyl is a suitable aryl group. The alkyl and aryl groups may be suitably substituted by, for example, aryl, alkyl, alkylene, halo, alkoxy or hydroxy. The group $R^2$ of formula (I) is preferably an alkylene carbon that forms a vinyl group with the carbon pendant to the butadiene backbone (i.e., $R^2$ is $CH_2=$), although a polybutadiene of formula (I) can be modified so that for one or more units of the butadiene the group $R^2$ is other than an alkylene carbon. For example such an alkylene group can be saturated so that $R^2$ is an alkyl carbon such as methyl. The value n of the above formula (I) is suitably 2 or greater, more preferably n is a value between about 10 and 25, still more preferably n is a value between about 20 and 25.

The polybutadiene of formula (I) above preferably has a molecular weight (weight average) of at least about 4000, preferably has a molecular weight of between about 4000 and 8000, still more preferably has a molecular weight between about 5000 and 6000.

A polybutadiene of formula (I) can be prepared in several ways. For example, a commercially available polybutadiene can be selectively oxidized to provide internal epoxide groups. Typically poly-1,3-butadienes are employed. Polybutadienes, including polybutadiene that with varying terminal groups including reactive groups such as hydroxy, are available from vendors such as BF Goodrich, Nisso and Japan Synthetic Rubber. Under appropriate reaction conditions, an internal alkylene group will be more reactive to electrophilic substitution than a pendant vinyl group (i.e., where $R^2$ above is an alkylene carbon). Thus, an internal carbon-carbon double bond of the polybutadiene can be converted to a halohydrin by reaction with a halogen such as $Cl_2$ or $Br_2$ in the presence of water and a substantially non-nucleophilic solvent such as tetrahydrofuran or an aromatic solvent such as toluene or xylene. The epoxide can then be formed by alkaline treatment of the halohydrin. Suitable bases for formation of the internal epoxide via a halohydrin include alkoxides such as potassium t-butoxide and hydroxides such as sodium hydroxide. In formation of the halohydrin, a stoichiometric equivalent of halogen should be employed to limit addition to the more reactive disubstituted internal vinyl groups of the polybutadiene.

It is also believed that direct oxidation of the internal alkylene group of the polybutadiene can be employed to form a epoxidized polybutadiene of the invention. For example, a commercially available polybutadiene can be admixed in a suitable solvent and reacted with a suitable oxidant to provide the epoxide group. Suitable oxidants will include peracids such as perbenzoic acid, meta-chlorobenzoic acid, peracetic acid and trifluoroperacetic acid; alkaline oxidants such as sodium hydroxide and hydrogen peroxide (30 wt. % in water); or a substantially neutral oxidation of bubbling $O_2$ gas through the reaction mixture in the presence of a suitable catalyst such as Ag.

The internally epoxidized polybutadiene is preferably miscible with other components(s) of the composition both before and after curing. An epoxidized polybutadiene that is miscible with other components upon curing is believed to form a clear coating layer upon curing of the composition while a butadiene that is not miscible will provide an opaque cured coating layer, for example a milky-colored coating layer. While not wishing to be bound by theory, it is believed a clear, cured coating layer indicates the formation of a polymerized network comprising a substantially uniform distribution of the polymerizable components of the composition.

The concentration of the internally epoxidized butadiene component may vary within relatively broad ranges, and in general the internally epoxidized polybutadiene is employed in a concentration of at least about 10 weight percent of the total solids of a composition, more typically from about 10 to 60 or more weight percent of the total solids, still more typically from about 25 to 55 weight percent of total solids of a composition.

The compositions of the invention further includes radiation polyvinylphenol resin having a minor portion of its hydroxyl groups mesylated admixed with a novolak resin.

In addition to the resin and epoxidized polybutadiene components described above the photoresist contains a photoacid producing compound which undergoes photolysis with activating radiation at a wavelength of about 320 to 420 nanometers to yield a strong halogen acid. Suitable acid producing compounds halomethyl-s-triazines which conform to the following formulae II:

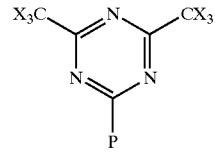

where P is a substituted or unsubstituted phenyl group or a substituted or unsubstituted naphthyl group and each X may be the same or different and each represents a halogen atom, preferably Cl or Br. Preferably P is the group:

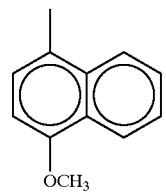

when X is Cl or Br.

A preferred halomethyl-s-triazine conforms to the following formula III:

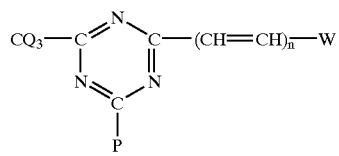

wherein Q is bromine or chlorine, P is NHR, —$NR_2$, or —OR where R is phenyl or lower alkyl (lower alkyl meaning an alkyl group having 6 carbon atoms); n is an integer from 1 to 3; and W is an optionally substituted aromatic or heterocyclic nucleus or the compound of formula IV:

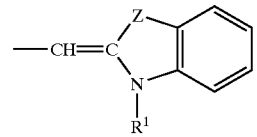

where Z is oxygen or sulfur and $R^1$ is hydrogen, a lower alkyl or phenyl group. Of course, where W is an aromatic or heterocyclic nucleus, the ring may be optionally substituted. Without attempting an exhaustive listing of substituents, the following are noted as typical: chloro, bromo, phenyl, lower alkyl (an alkyl having no more than 6 carbon atoms), nitro phenoxy, alkoxy, acetoxy, acetyl, amino and alkyl amino.

The s-triazine compounds as described above generate free radicals when irradiated with actinic radiation of a wavelength from about 320 to about 420 nanometers. For this reason, the compounds are useful as photoinitiators in light sensitive compositions herein within the i-line wavelengths.

The s-triazine compounds are condensation reaction products of certain methyl-halomethyl-s-triazines and certain aldehydes or aldehyde derivatives. They may be prepared by the procedures disclosed in the above cited U.S. Pat. No. 3,954,475 and in accordance with the teachings of Wakabayashi et al., Bulletin of the Chemical Society of Japan, 42, 2924–30 (1969).

Specific examples of halogenated triazines suitable for use as photoacid generators in the invention include for example, 2-[1-(3,4-benzodioxolyl)]-4,6-bis (trichloromethyl)-1,2,5-triazine, 2-[1-(2,3-benzodioxolyl)]-4,6-bis(trichloromethyl)-1,3,5-triazine, 2-[1-(3,4-benzodioxolyl)]-4,6-bis(tribromomethyl)-1,3,5-triazine, 2-[1-(2,3-benzodioxolyl)]-4,6-bis(tribromomethyl)-1,3,5-triazine, 2-(2-furfylethylidene)-4,6-bis(trichloromethyl)-1, 3,5-triazine, 2-[2-(5-methylfuryl)ethylidene]-4,6-bis (trichloromethyl)-1,3,5-triazine, 2-[2-(4-methylfuryl) ethylidene]-4,6-bis(trichloromethyl)-1,3,5-triazine, 2-[2-(3-methylfuryl)ethylidene]-4,6-bis-(trichloromethyl)-1,3,5-triazine, 2-[2-(4,5-dimethylfuryl)ethylidene]-4,6-bis (trichloromethyl)-1,3,5-triazine, 2-[2-(5-methoxyfuryl) ethylidene]-4,6-bis(trichloromethyl)-1,3,5-triazine, 2-[2-(4-methoxyfuryl)ethylidene]-4,6-bis(trichloromethyl)-1,3,5-triazine, 2-[2-(3-methoxyfuryl)ethylidene]-4,6-bis (trichloromethyl)-1,3,5-triazine, 2-[2-(4,5-dimethoxy-furyl) ethylidene]-4,6-bis(trichloromethyl)-1,3,5-triazine, 2-(2-furfylethylidene)-4,6-bis(tribromomethyl)-1,3,5-triazine, 2-[2-(5-methylfuryl)ethylidene]-4,6-bis(tribromoethyl)-1,3, 5-triazine, 2-[2-(4-methylfuryl)-ethylidene]-4,6-bis (tribromomethyl)-1,3,5-triazine, 2-[2-(3-methylfuryl) ethylidene]-4,6-bis(tribromomethyl)-1,3,5-triazine, 2-[2-(4, 5-dimethoxyfuryl)ethylidene]-4,6-bis(tribromomethyl)-1,3, 5-triazine, 2-[2-(5-methoxyfuryl)ethylidene]-4,6-bis (tribromomethyl)-1,3,5-triazine, 2-[2-(4-methoxyfuryl) ethylidene]-4,6-bis(tribromomethyl)-1,3,5-triazine, 2-[2-(3-methoxyfuryl)ethylidene]-4,6-bis(tribromomethyl)-1,3,5-triazine, 2-[2-(4,5-dimethoxyfuryl)ethylidene]-4,6-bis (tribromomethyl)-1,3,5-triazine, 2,4,6-tris-(trichloromethyl)-1,3,5-triazine, 2,4,6-tris-(tribromomethyl)-1,3,5-triazine, 2-phenyl-4,6-bis (trichloromethyl)-1,3,5-triazine, 2-phenyl-4,6-bis (tribromomethyl)-1,3,5-triazine, 2-(4-methoxyphenyl)-4,6-bis(trichloromethyl)-1,3,5-triazine, 2-(4-methoxyphenyl)-4, 6-bis(tribromomethyl)-1,3,5-triazine, 2-(1-naphthyl)-4,6-bis (trichloromethyl)-1,3,5-triazine, 2-(1-naphthyl)-4,6-bis (tribromomethyl)-1,3,5-triazine, 2-(4-methoxy-1-naphthyl)-4,6-bis(trichloromethyl)-1,3,5-triazine, 2-(4-methoxy-1-naphthyl)-4,6-bis(tribromomethyl)-1,3,5-triazine, 2-(4-chlorophenyl)-4,6-bis(tribromomethyl)-1,3,5-triazine, 2-styryl-4,6-bis(trichloromethyl)-1,3,5-triazine, 2-styryl-4, 6-bis(tribromomethyl)-1,3,5-triazine, 2-(4-methoxystyryl)-4,6-bis(trichloromethyl)-1,3,5-triazine, 2-(4-methoxystyryl)-4,6-bis(tribromomethyl)-1,3,5-triazine, 2-(3,4,5-trimethoxystyryl)-4,6-bis(trichloromethyl)-1,3,5-triazine, 2-(3,4,5-trimethoxystyryl)-4,6-bis (tribromomethyl)-1,3,5-triazine, 2-(3-chloro-1-phenyl)-4,6-bis(trichloromethyl)-1,3,5-triazine, 2-(3-chlorophenyl)-4,6-bis(tribromomethyl)-1,3,5-triazine and the like.

Other photoacid generator activated at 320 to 420 nanometers suitable for use in this invention include substantial oxadiazols of the formula V

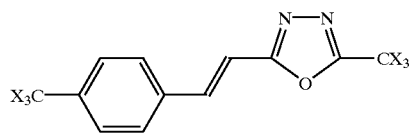

where X is Cl or Br and in particular where X is Cl.

Other triazine type photoacid producers that may be used for i-line exposure are disclosed in EP application 0,458,325 and taught in U.S. Pat. No. 5,366,846.

The acid-generating agents compounds disclosed herein may be used alone or in admixture. The amount of acid generator may vary from about 0.01 to 5 parts by weight, preferably 0.1 to 3 parts by weight, per 100 parts by weight of the specific alkali soluble resin. When the amount of the acid-generator is less than 0.01 parts by weight, it is difficult to form a resist pattern and when the amount exceeds 5 parts by weight, the ability to strip the resist from the substrate becomes difficult.

In addition to the above a spectral photosensitizer component may also be included in the negative photoresist composition.

The preferred spectral photosensitizers are anthracene or substituted anthracene compounds such as diphenylanthracene, phenanthracene thioxanthones such as isopropyl thioxanthones of the structure:

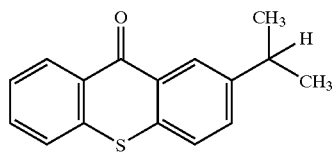

A compound that contains at least two vinyl ether groups is a suitable crosslinker for compositions that comprise a photoacid generator compound as disclosed herein. Examples of compounds with at least two vinyl ether groups include divinyl ethers of aliphatic, cycloaliphatic, aromatic or araliphatic diols. Examples of such materials include divinyl ethers of aliphatic diols having from 1 to 12 carbon atoms, polyethylene glycols, propylene glycols, polybutylene glycols, dimethylcyclohexanes, etc. Specific examples include divinyl ethers of ethylene glycol, trimethylene-1,3-diol, diethylene glycol, triethylene glycol, dipropylene glycol, tripropylene glycol, resorcinol, Bisphenol A, etc. A composition of the invention may also suitably comprise a melamine as a crosslinker or a composition may contain two or more different crosslinkers.

The concentration of the one or more crosslinkers in a composition may vary within a relatively wide range. As will be appreciated to those skilled in the art, suitable concentrations will vary with factors such as crosslinker reactivity and specific application of the composition. In general, a suitable concentration of one or more crosslinkers is about 5 to 30 weight percent of toal solids of the composition, preferably about 10 to 20 weight percent of total solids.

Other additives may be optionally included in the compositions of the invention such as dyes, fillers, wetting agents, fire retardants and the like. A suitable filler is the product sold under the name TALC by Cyprus Chemical and a suitable dye is Orasol Blue available from Ciba Geigy.

Thermal curing after development may be conducted at temperatures ranging from about 120° to 180° C., preferably 120° to 140° C., for a period of time between about 20 to 120 minutes. The thermal cure hardens unreacted components, promotes flexibility of the coating layer and can enhance adhesion of the coating layer to the substrate. The coating layer also may be post cured using RF or microwave energy by methods well known in the coatings industry.

The compositions of the invention will be highly useful as flexible photoimageable cover coats in the manufacture of flexible circuits. A suitable process for the manufacture of a flexible circuit provides for etching a flexible base material to form a circuit layer by standard procedures (e.g., print and etch), stripping of photoresist, followed by cleaning of the base material surface. A composition of the invention is then applied to the cleaned surface. The composition may be suitably applied to the base material by a variety of coating means, for example roller coating or screen coating. The applied coating layer is then imaged and developed to provide openings, e.g., for solder pads. The coated base material can then be processed and used in accordance with known procedures. For such flex circuit applications, the photoimageable composition preferably comprises a brominated phenolic resin binder to provide a more fire retardant composition coating layer. As is clear to those in the art, a brominated phenolic resin is a resin where at least a portion of the resin phenolic units are bromo substituted at one or more available ring positions.

Compositions of the invention will also be useful as dielectric innerlayers for multilayer printed circuit boards that are produced by a sequential layering process as described above and in U.S. Pat. No. 4,902,610. For example, a composition of the invention can be coated over a first circuit layer and then the coating layer imaged to provide openings that define interconnections, and then one or more other board layers sequentially formed over the imaged composition layer to form a circuit board having two or more layers of circuitry. The first circuit layer will be in electrical connection with other circuit layer(s) of the board by means of the imaged openings of the coating layer. A typical application of a dielectric innerlayer would comprise application of a two mil layer of a photoimageably composition of the invention over a pre-cleaned circuitry substrate having 6-mil wide conductors, formation of 3-mil diameter via apertures in the coating layer by means of exposure and developed as discussed above; and post-development curing of the photodielectric layer. The via apertures will be located at predetermined sites within the width of the underlying conductors. Thus the apertures can be formed simultaneously rather than individually drilling holes as is done in conventional multilayer board manufacturing processes. Further, the apertures can be significantly smaller in such a sequential fabrication process than can be done by drilling. For example, photoformed via apertures can be provided with diameters as small as 2-mil. Additionally, via apertures of any shape can be imaged and developed, including squares and slots. The vias can then be plated with electroless copper at the same time as the second layer of circuitry conductors are plated.

Other applications of the compositions of the invention include use as an outerlayer for surface pad mounts where, the pads interconnected to the underlying circuit layer of a printed circuit board by means of electrolessly plated photoformed vias. The compositions of the invention can also be used as a resist in full-build additive plating processes such as printed circuit manufacturing processes. For a full-build additive circuit manufacturing process, it is highly desirable to employ a permanent photoimageable dielectric mask as insulation between the electrolessly plated circuitry conductors. Further, the photoimageable mask should be capable of fine line resolution, aqueous developable and serve as a resist to full build high pH electroless copper plating solutions for many hours at elevated temperatures without unwanted extraneous copper deposition on the mask.

The following non-limiting Examples are illustrative of the invention.

EXAMPLES 1 THROUGH 12

Four different photoimageable compositions of the invention were prepared by the components in the amounts as specified in the below Table. Amounts listed in grid are expressed in parts by weight based on the total weight (including solvent) of the specified composition.

TABLE

| Composition of Example No. | Resin Binder | Amount Resin Binder | Amount Epoxidized Butadiene | Amount Melamine | Amount Divinyl Ether | Amount Acid Producer |
|---|---|---|---|---|---|---|
| 1 | A | 50 | 30 | 10 | 0 | 4 |
| 2 | B | 45 | 35 | 10 | 0 | 4 |
| 3 | C | 45 | 35 | 10 | 0 | 4 |
| 4 | D | 50 | 30 | 10 | 0 | 4 |
| 5 | E | 60 | 30 | 10 | 0 | 4 |
| 6 | F | 50 | 40 | 10 | 0 | 4 |
| 7 | A | 50 | 0 | 10 | 30 | 4 |
| 8 | B | 45 | 0 | 10 | 35 | 4 |
| 9 | C | 45 | 0 | 10 | 35 | 4 |
| 10 | D | 50 | 0 | 10 | 30 | 4 |
| 11 | E | 60 | 0 | 10 | 30 | 4 |
| 12 | F | 50 | 0 | 10 | 40 | 4 |

In addition to the components listed in the above Table, 2-ethyl-9,10-dimethoxyanthracene was employed as a photosensitizer in each of the compositions at a concentration of 1 part by weight based on the total weight of the specified composition.

The solvent used in each of the compositions was propylene glycol monomethyl ether acetate. Each of the compositions was formulated at about 42 percent by weight solids.

In the above Table, the following designations represent the following materials:
Resin Binders A is a cresol-formaldehyde novolak having a molecular weight (weight average) of about 11,000.

B is a m-cresol-formaldehyde having a melting point of about 145–155° and a molecular weight (weight average) of about 5500.

C is a poly(vinylphenol) resin having a molecular weight (weight average) of about 5200.

D is a poly(vinylphenol) resin having a molecular weight (weight average) of about 13700.

E is a partially hydrogenated polyvinyl phenol resin containing phenolic and nonaromatic cyclic alcohol units and having a molecular weight (weight average) of about 5200.

F is a polyacrylate formed by free radical polymerization of the following monomer mixture: about 12 parts by weight methacrylic acid, 8 parts by weight hydroxyl-ethylmethyl acrylate, 40 parts by weight butyl acrylate and 49 parts by weight methylmethacrylate.

The divinyl ethers may be selected from e.g., BDDVE, DVE-2, DVE-3, DVE-4, ESDVE, HDDVE, CHDVE, DVE-4, DES200-DVE and PTHF 290-DVE manufactured by BSAF and ISP.

The epoxy butadiene used in the compositions was an epoxidized polybutadiene obtained from Atochem North America, Inc. (Philadelphia, Pa.) under the tradename Poly bd 605 Resin and was a compound of formula (I) as defined above where R and $R^1$ are both hydroxyl and $R^2$ is an alkylene carbon that forms a pendant vinyl group. The polybutadiene had a molecular weight of about 5500 and an epoxy equivalent weight of about 260.

The melamine used in the compositions was a melamine-formaldehyde resin available from American Cyanamid under the trade name Cymel 303.

The acid producer used in the compositions was the compound known as Triazine B of the formula:

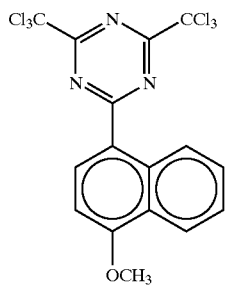

EXAMPLE 13

Formation of Relief Images

Each of the compositions of Examples 1–4 above is separately applied by Meier rod to a dry film thickness of about 22 to 28 microns on the copper surface of a one-sided copper-clad plastic laminate. Prior to application of a composition, the copper surface of the substrate is scrubbed clean with pumice-based Scrub Cleaner 28 (available from Shipley Company), followed by water rinsing and drying of the scrubbed copper surface. The applied liquid coatings is dried for 30 minutes in a 90° C. fresh air circulating convection oven. The coated parts is then each exposed with a Mimir light source using a 250 mJ/cm² exposure dose, except for the part coated with the composition of Example 5 which required a higher exposure dose. The compositions of each of Examples 1–4 is subject to broad band exposure. Following exposure, the coated parts is post exposure baked for 20 minutes at 90° C. After cooling, the exposed coating layers is immersion developed at about 30–35° C. with Developer 303A (aqueous sodium hydroxide developer available from the Shipley Company). The developed coating layers is then cured at either 135° C. or 160° C. for 60 minutes.

EXAMPLE 14

Adhesiveless copper-clad films of the polyimide sold under the tradename KAPTON were etched to remove the copper. The composition of Example 1 above is applied to the KAPTON film to provide film thicknesses of about 20–25 microns. The coated films were exposed, developed and cured as described in U.S. Pat. No. 5,340,697, Example 18 (incorporated herein by reference).

EXAMPLE 15

The compositions of Examples 2 and 3, are each coated onto separate copper-clad plastic laminates and dried, exposed, enhancement baked, developed and cured by the procedures described in Example 18 of U.S. Pat. No. 5,340,697 (incorporated herein by reference). The cured composition layer is then cut in a cross hatch pattern with a razor blade.

EXAMPLE 16

Full-build Additive Plating

One ounce copper clad epoxy laminates substrates is etched to thereby bare a roughened epoxy surface with micropores. The substrates is then immersed in the electroless catalyst solution CATAPOSIT 44 (available from the Shipley Company) for five minutes followed by water rinsing and drying of the treated substrates. By means of a #44 Meier rod, the compositions of Example 3 is applied to separate catalyzed copper clad substrates, dried, image exposed, enhancement post exposure baked for 15 minutes at 100° C., developed with 303A Developer (Shipley Company), rinsed, dried and cured for 60 minutes at 140° C. to provide 1.1 mil deep trenches exposing the catalyzed epoxy in a circuitry pattern. The parts is then immersed in Accelerator 19A (available from Shipley Co.) for five minutes to accelerate the palladium/tin plating catalyst, water rinsed, and is then placed in a full build electroless copper bath until a 1 mil thickness (about 25 microns) is deposited in the noted trenches. The plating bath is operated at about 70° C. and deposited copper at 2.2 microns per hour.

EXAMPLE 17

Each of the compositions as described in Examples 1 to 12 are coated onto a polyester film such as MYLAR® brand polyester film, and dried. The dried composition is then covered with a polyethylene cover sheet to produce a dry film photoresist useable as described in 13 to 16.

In use, the polyethylene sheet is removed and the photoresist composition is roll laminated to copper surface during the sequential build passes. See for example, U.S. Pat. Nos. 4,992,354 and 5,213,945 which disclose use of a dry film photoresist.

The foregoing description of the invention is merely illustrative thereof, and it is understood that variations and modifications can be effected without departing from the scope or spirit of the inventions as set forth in the following claims.

What is claimed is:

1. A photoimageable composition which is photoimageable at a wavelength of about 320 to about 420 nanometers, said composition comprising in combination a photoacid producing substituted triazine compound or substituted oxidiazol compound, a polybutadiene that comprises one or more internal expoxide groups, a photosensitizer, a crosslinking agent and a resin binder.

2. The composition of claim 1 where the resin binder is selected from the group consisting of (1) a novolak resin, (2) a poly(vinylphenol) resin, (3) a resin containing phenolic units and cyclic alcohol units, (4) a brominated phenolic resin and (5) a polyacrylate.

3. The composition of claim 1 which is developable in an aqueous alkaline solvent.

* * * * *